United States Patent
Schliebusch et al.

(10) Patent No.: US 7,373,638 B1
(45) Date of Patent: May 13, 2008

(54) AUTOMATIC GENERATION OF STRUCTURE AND CONTROL PATH USING HARDWARE DESCRIPTION LANGUAGE

(75) Inventors: Oliver Schliebusch, Herzogenrath (DE); Andreas Hoffmann, Herzogenrath (DE); Achim Nohl, Aachen (DE); Gunnar Braun, Aachen (DE); Heinrich Meyr, Borgnone (CH)

(73) Assignee: CoWare, Inc., San Jose, CA (US)

( * ) Notice: Subject to any disclaimer, the term of this patent is extended or adjusted under 35 U.S.C. 154(b) by 689 days.

(21) Appl. No.: 10/641,457

(22) Filed: Aug. 14, 2003

Related U.S. Application Data

(60) Provisional application No. 60/403,882, filed on Aug. 16, 2002.

(51) Int. Cl.
*G06F 9/45* (2006.01)
*G06F 9/44* (2006.01)
*G06F 17/50* (2006.01)

(52) U.S. Cl. .................. 717/136; 717/107; 717/108; 703/14; 703/15; 716/18

(58) Field of Classification Search .............. 717/107, 717/108, 136; 703/13, 14, 15; 716/18
See application file for complete search history.

(56) References Cited

U.S. PATENT DOCUMENTS 5,918,035 A * 6/1999 Van Praet et al. ............ 703/22
6,173,331 B1   1/2001 Shimonishi
6,226,776 B1 * 5/2001 Panchul et al. ................ 716/3

OTHER PUBLICATIONS

Souvik Basu, "High level Synthesis from Sim-nml Processor Specificatgions", A Thesis Submitted in Partial Fulfillment of the Requirements for the degree of Master of Technology, pp. 1-63, [online] Aug. 2001, [retrieved on Oct. 5, 2006]. Retrieved from the internet: <http://www.cse.iitk.ac.in/research/metch/1999/9911150.html>.*
Fauth et al., "Describing Instruction Set Processor Using nML", 1995 IEEE 1066-1409/95, pp. 503-507.*
Itoh et al., "Synthesizable HDL generation for pipelined processors from a micro-operation description", IEICE Trans, Fundamentals, vol. E83-A, No. 3 Mar. 2000, pp. 394-400.*
Hoffmann et al., A Methodlolgy for the Dssign of Application Sepcific Instruction Set Processors (ASIP) Using the Machine Description Language LISA, Year of Publication: 2001, ISBN:0-7803-7249-2, IEEE Press. pp. 625-630.*
Schliebusch et al., "Architecture Implementation Using The Machine Description Language Lisa" Design Automation Conference, 2002.

* cited by examiner

*Primary Examiner*—Tuan Dam
*Assistant Examiner*—Zheng Wei

(57) ABSTRACT

Translating to a hardware description language (HDL) from an architecture description language (ADL) is disclosed. An architecture description that is written in the ADL and has a hierarchical organization is received. Decoders are generated, described in the HDL, from the architecture description written in the ADL. Control signals are generated, described in the HDL, from the architecture description written in the ADL. The decoders are configured to output the control signals and the control signals are input to functional units in order to preserve the hierarchical organization of the architecture description written in the ADL.

23 Claims, 6 Drawing Sheets

AUTOMATIC GENERATION OF STRUCTURE AND CONTROL PATH USING HARDWARE DESCRIPTION LANGUAGE

RELATED U.S. APPLICATION

This application claims priority to U.S. Provisional Application entitled, "Architecture Implementation Using the Machine Description Language LISA," Application No. 60/403,882 filed on Aug. 16, 2002, which application is hereby incorporated by reference.

FIELD OF THE INVENTION

The present invention relates to the field of software tools for architecture exploration and implementation. Specifically, embodiments of the present invention relate to automatically generating a control path description in a hardware description language from an architecture described in an architecture description language (ADL), while preserving the hierarchical organization of the ADL description.

BACKGROUND ART

Today's communication market faces strong competition and multiple new standards. For this reason, many systems, such as mobile devices, networking products, and modems require new embedded processors (EP). These EPs can either be general purpose, such as microcontrollers (µC) and digital signal processors (DSP), or application specific, using application specific instruction set processors (ASIP). Finding a best-in-class solution involves exploring the tradeoff between a general design that is highly flexible and a specific design that is highly optimized. This design exploration phase is conventionally very time consuming; however, given the importance of short product development cycle times, reducing the time required for the design exploration phase is highly significant.

Moreover, the design exploration phase is only a portion of the overall development process. The development process of new EPs is separated into several development phases, such as design exploration, software tools design, system integration, and design implementation. Significantly, the different design phases are assigned to different design engineering groups with specific expertise in their respective fields. Moreover, software tools and description languages vary from phase to phase. Thus, another important factor in the design of a new architecture is communication and verification between different design groups or at least design phases.

Another obstacle in the development process is that design tools that are used in one phase are often not suitable for use in another phase. Two types of languages that are used in the development process are hardware description languages (HDL) and instruction set languages (ISL). Hardware description languages (HDLs), such as VHDL or Verilog, are widely used to model and simulate processors, but mainly with the goal of implementing hardware. However, there are a number of drawbacks in using HDL models to explore the new architecture and to generate production quality software development tools, especially for cycle-based or instruction-level processor simulation. One disadvantage is that HDLs cover a huge amount of hardware implementation details that are not needed for performance evaluation, cycle-based simulation, and software verification. On the other hand, ISLs are mainly designed to retarget the software development tools, sometimes a complete tool suite. However, ISLs operate on a high level of abstraction to provide as much convenience as possible for fast and efficient design exploration phases. Unfortunately, ISLs do not contain the required information about the underlying hardware to allow a hardware description to be formed therefrom. Conventional development processes that use an ISL and an HDL require that new code be written in each language each time a modification is made to the design of the architecture being developed.

Therefore, it would be advantageous to provide a method that reduces the time required for the design exploration phase when designing a new processor. It would be further advantageous to provide such a method that facilitates communication and verification between different design groups and phases in the development process. It would be further advantageous to meet the above constraints while being compatible with existing technologies for developing processors.

SUMMARY OF THE INVENTION

Embodiments of the present invention provide methods and systems of automatically generating a control path in a hardware description language (HDL). Embodiments in accordance with the present invention reduce the time required for the design exploration phase when designing a new processor. Embodiments in accordance with the present invention facilitate communication and verification between different design groups and phases in the development process. Embodiments in accordance with the present invention meet the above while being compatible with existing technologies for developing processors.

A method of automatically generating a control path in a hardware description language (HDL) from an architecture description language (ADL) is disclosed. In one embodiment in accordance with the present invention, the method comprises receiving an architecture description that is written in the ADL and has a hierarchical organization. The method also comprises generating decoders, described in the HDL, from the architecture description written in the ADL. The method also comprises generating control signals, described in the HDL, from the architecture description written in the ADL. The decoders are configured to output the control signals and the control signals are input to functional units. Systems implemented in accordance with the above method are also described herein.

Embodiments of the present invention provide these advantages and others not specifically mentioned above but described in the sections to follow.

DETAILED DESCRIPTION OF THE INVENTION

Figure 1:
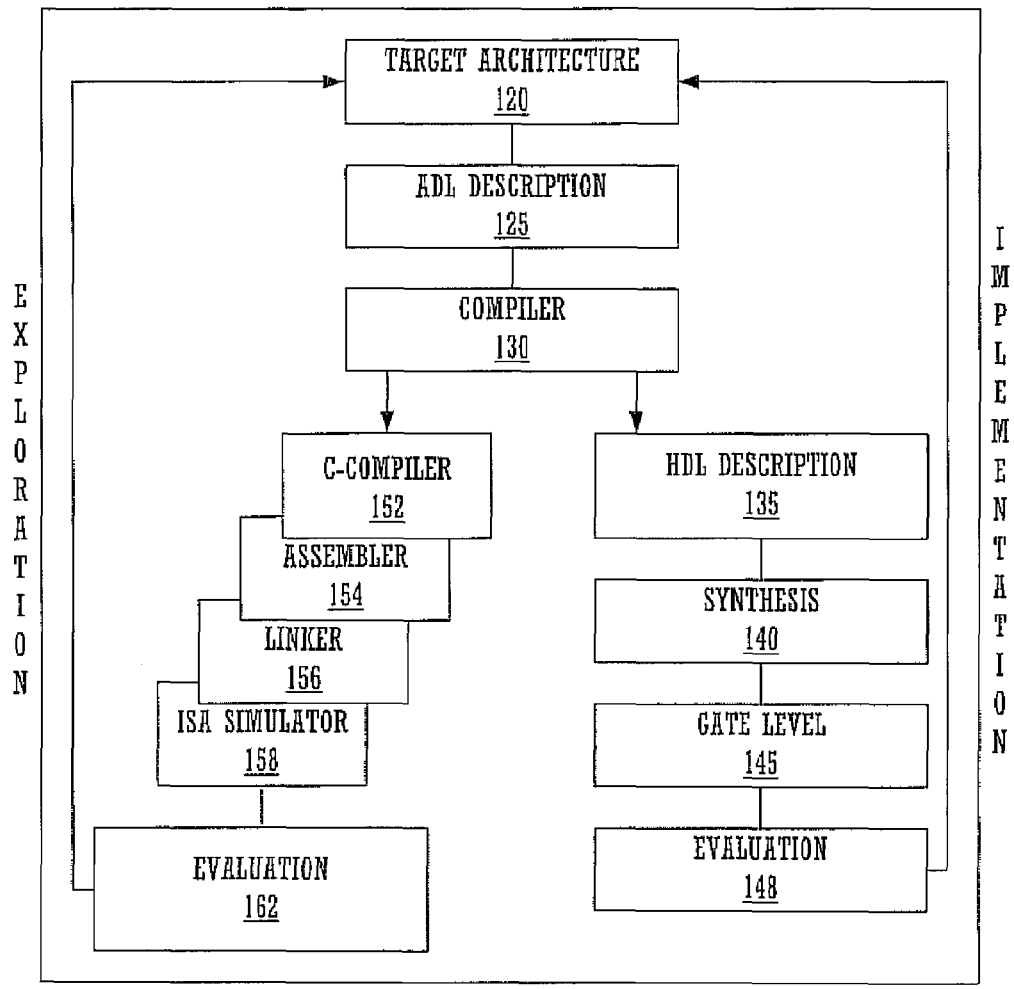
FIG. 1 is a diagram illustrating a target architecture exploration and implementation process flow according to an embodiment of the present invention.

In the following detailed description of embodiments of the present invention, automatically generating a control path in a hardware description language (HDL) from an architecture description language (ADL), numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing" or "receiving" or "generating" or "processing" or "computing" or "translating" or "calculating" or "determining" or "compiling" or "returning" or "storing" or "decoding" or "tailoring" or "simulating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In order to facilitate architecture development, different types of description languages may be used for different purposes. For example, an Architecture Description Language (ADL) might be used to describe the target architecture from the instruction set view, whereas a Hardware Description Language (HDL) might be used to model the underlying hardware in detail. It is desirable to have a simple, efficient, and accurate way to automatically generate at least a portion of the HDL description. Embodiments of the present invention automatically generate structure and a control path comprising decoders and control signals in an HDL description from a target architecture written in an ADL. Moreover, embodiments of the present invention preserve the hierarchical organization of the ADL description of the target architecture in the generated HDL description. It is further desirable that the designer has flexibility in the target architecture design. Embodiments of the present invention generate an HDL description of the target architecture that may have any number of decoders. Thus, the decoders may be tailored to a particular stage of a pipeline. Embodiments of the present invention operate on an input ADL described target architecture that may have any number of pipeline stages. The foregoing provides the designer with great design flexibility.

FIG. 1 is a diagram 115 illustrating exploring and implementing a target architecture 120, according to an embodiment of the present invention. Embodiments of the present invention facilitate the design process of FIG. 1, providing flexibility, efficiency, and accuracy. In general, FIG. 1 is divided into a portion representing architecture exploration and a portion representing target architecture implementation. Embodiments of the present invention automatically generate at least a portion of the HDL description 135 from the ADL description 125, as will be described more fully below. In particular, embodiments of the present invention automatically generate a control path comprising decoders and control signals in an HDL description from an ADL description. The target architecture 120 is described in an ADL at box 125. The target architecture 120 may by a processor implemented in an integrated circuit, although the present invention is not so limited. In one embodiment, the ADL is substantially compliant with the LISA language (Language for Instruction Set Architectures), although this is not required for the present invention. A language compiler 130 is used to produce a control path comprising decoders and control signals in an HDL description 135 of the target architecture, according to an embodiment of the present invention. Automatically generating the decoders and control signals greatly facilitates the overall design process.

The generated HDL description 135 does not consist of any predefined components, such as ALUs or basic control logic. Therefore, the compiler 130 derives all necessary information from the given ADL description 125, in accordance with embodiments of the present invention. The ADL description 125 of the target architecture has a hierarchical organization. The automatically generated control path in the HDL description 135 of the target architecture maintains the hierarchical organization of the ADL. Heretofore, conventional techniques of producing an HDL description from an ADL description produced a flattened control path description. Some conventional ADL descriptions do not have a hierarchical organization, and, therefore, any HDL description produced therefrom is not hierarchically organized. Other conventional ADL descriptions are hierarchically organized, but the conventional translation to HDL flattens the hierarchical organization. Hence, conventional techniques do not automatically generate an HDL description from an ADL description, while preserving the hierarchical organization of the ADL. Thus, conventional techniques are limited in the power and flexibility that they provide to architecture designers. In contrast, embodiments of the present invention provide flexibility to designers by maintaining the hierarchical organization of the ADL description in the translated HDL description.

Still referring to FIG. 1, as a part of the implementation phase, a gate level model 145 of the target architecture is produced by using conventional synthesis tools 140. Suitable synthesis tools are commercially available from Synopsis Corporation of Mountain View, Calif. Box 148 represents evaluating the results of the implementation phase. For example, issues such as chip size, clock speed, power consumption, etc. are evaluated. The evaluation results may be used to modify the target architecture design 120, as indicated by the arrow from evaluation box 148 into the target architecture design 120.

Referring still to FIG. 1, the language compiler 130 may also produce software tools 152-158 that may be used in the architecture implementation phase. However, the present invention does not require that the compiler 130 generate software tools 152-158. The LISA 2.0 processor design platform (LPDP), commercially available from CoWare corporation of San Jose, Calif., provides automatic generation of software development tools 152-158 for architecture exploration and application design, as well as hardware-software co-simulation interfaces from one sole specification of the target architecture (e.g., ADL description 125) in the LISA 2.0 language. The software tools in FIG. 1 include: a compiler 152, for example, a C compiler; an assembler 154, which translates text-based instructions into object code for the respective programmable architecture; a linker 156; and an Instruction-Set Architecture (ISA) simulator 158 capable of cycle accurate simulation including support for deep instruction and data pipelines.

The various software tools 152-158 are used to evaluate the architecture design, as indicated in evaluation box 162. The results of the evaluation may be used to modify the target architecture 120, as indicated by the arrow from the evaluation box 162 to the target architecture box 120.

The modification of the target architecture 120 involves modification to the ADL description 125. Because a control path (e.g., decoders and control signals) in the HDL description 135 of the target architecture are automatically generated from the ADL description 125 of the target architecture, the design process is accelerated versus techniques requiring that a new control path be manually written in the HDL. Moreover, it is much easier for a designer to code in an ADL that it is to code in an HDL because ADLs are descriptions of higher abstraction levels.

The HDL description 135 automatically generated by embodiments of the present invention fulfills tight constraints, and is thus an acceptable replacement for HDL code handwritten by experienced designers. Thus, embodiments of the present invention are suitable to facilitate design of modern EPs that are highly optimized with respect to factors such as clock speed, chip area, and power consumption.

Figure 2:
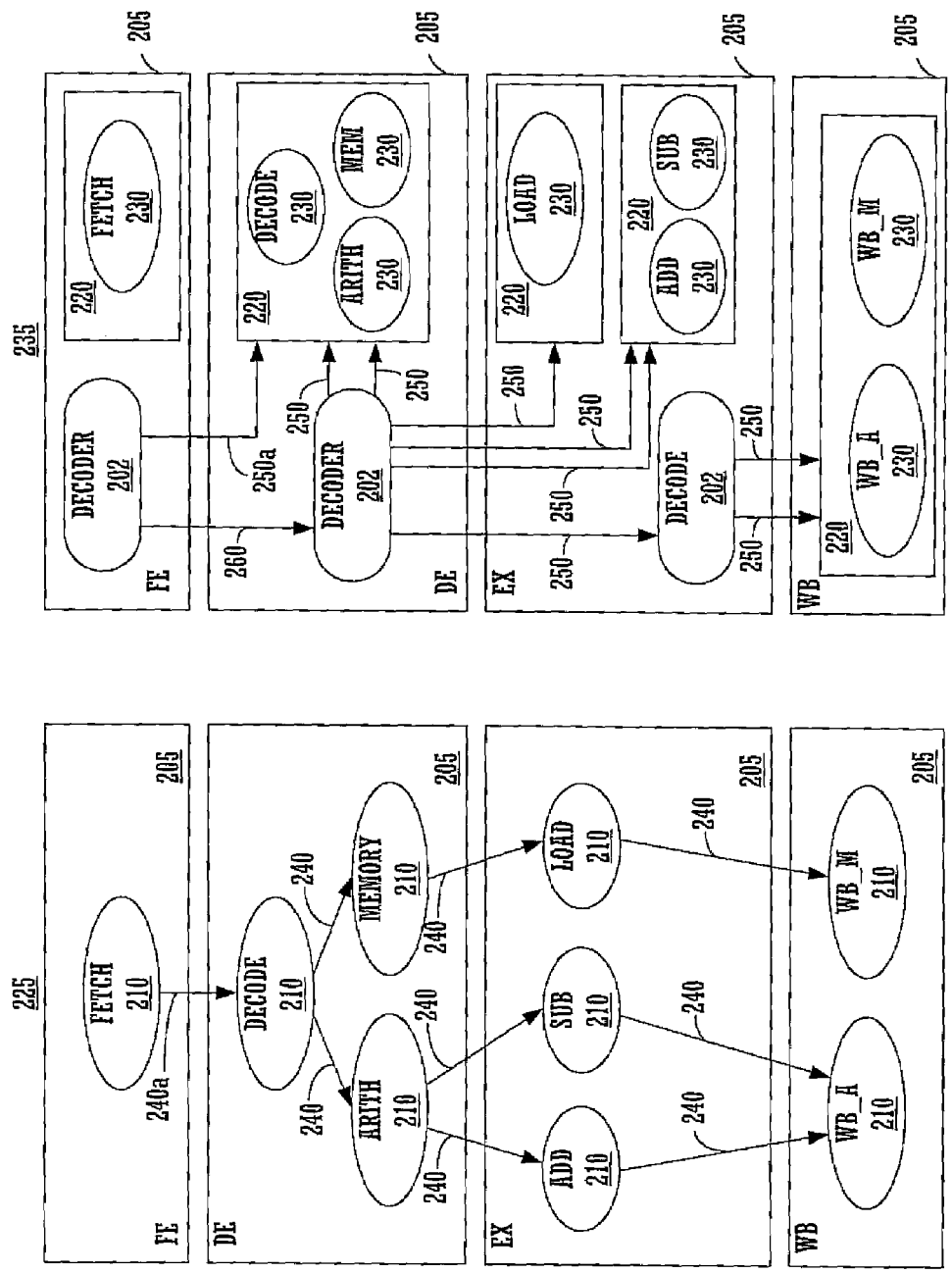
FIG. 2 is a diagram illustrating control path generation according to an embodiment of the present invention.

FIG. 2 is a diagram illustrating an exemplary ADL model 225 for an ADL description and an exemplary HDL model 235 for an HDL description to which it is converted, while preserving the hierarchical organization of the ADL description, according to an embodiment of the present invention. The exemplary ADL model 225 comprises four levels corresponding to four stages 205 in a pipeline. In the example of FIG. 2, the stages 205 are fetch (FE), decode (DE), execute (EX), and writeback (WB). However, other types of stages and other pipeline configurations may be used. Embodiments of the present invention can translate an ADL description having any number of pipeline stages into an HDL description. Thus, flexibility not found in conventional techniques is provided by embodiments of the present invention.

Moreover, the hierarchical organization of the ADL description is preserved in the HDL description. The exemplary HDL model 235 comprises a number of decoders 202. In contrast, conventional techniques have only a single generic decoder for the entire HDL description. Providing multiple decoders 202, as is done by embodiments of the present invention, has additional benefits. For example, the decoder configuration directly affects factors such as chip speed and area. Embodiments of the present invention give the designer control over the decoder configuration. The decoders 202, while not directly described in the ADL description, are implicitly described in the ADL description. Thus, designers have the flexibility to affect decoder configuration such that desired performance factors can be met or exceeded.

Referring still to FIG. 2, the exemplary ADL model 225 has a hierarchical organization comprising a number of operations 210. For example, the fetch (FE) stage 205 includes a fetch operation 210. The decode (DE) stage 205 includes a decode operation 210. The decode operation 210 loads the operands from a general purpose register into a pipeline register. In this example, the decode operation decodes between an arithmetic and memory operation 210 in the decode (DE) stage 205. The execute (EX) stage 205 contains an addition operation 210, which may add the values in the pipeline registers and write the result back to another pipeline register. Also in the execute (EX) stage 205 are a subtract operation 210 and a load operation 210. The writeback (WB) stage 205 includes a writeback operation 210, which writes the value from the pipeline register to general-purpose registers.

Still referring to FIG. 2, activation links 240 flow from one operation 210 to the next operation 210 in the exemplary ADL model 225. The operations 210 may activate each other, as indicated by the activation links 240. Thus, a schedule results, which rules the execution of the operations 210. For example, there is an activation link 240*a* between the fetch operation 210 and the decode operation 210. The status of the activation link 240 thus indicates whether the decode operation 210 should be executed. For each activation link 240 in the exemplary ADL model 225, there is a control signal 250 in the exemplary HDL model 235. For example, corresponding to activation link 240*a*, there is a control signal 250*a* in the exemplary HDL model 235 from the decoder 202 in the fetch (FE) stage 205 to the functional unit 220 in the decode (DE) stage 205. Thus, activation sequences are translated to control signals 250 in the HDL model 235, which are set or reset depending on the information given in the operation 210.

Decoders 202 are automatically generated in each stage 205 in which activation links 240 start. Therefore, three decoders 202 are generated, one decoder 202 in the fetch (FE) stage 205, one decoder 202 in the decode (DE) stage 205, and one decoder 202 in the execute (EX) stage 205 for the example of FIG. 2.

Still referring to FIG. 2, the exemplary HDL model 235 comprises a number of functional units 220 that contain processes 230 for implementing the operations 210. For example, there is a functional unit 220 in the fetch (FE) stage 205 of the exemplary HDL model 235 containing a fetch process 230 corresponding to the fetch operation 210 in the exemplary ADL model 225. As a further example, in decode (DE) stage 205 there is a functional unit 220 in the exemplary HDL model 235 that contains a decode process 230, an arithmetic process 230, and a memory process 230. The decode (DE) stage 205 of the exemplary ADL model 225 has a corresponding decode operation 210, arithmetic operation 210, and memory operation 210. The execute and writeback (WB) stages 205 of the exemplary ADL and HDL models 225, 235 have similar corresponding features. In one embodiment, frames for the functional units 220 are automatically generated. The HDL code to implement the processes 230 within the frames 220 may be developed in any suitable manner.

Still referring to FIG. 2, information is passed from one decoder 202 to the next in the exemplary HDL model 235, as is indicated by arrows 260. Various embodiments of the present invention generate an HDL representation of the target architecture in VHDL, Verilog, or SystemC.

In one embodiment, the ADL is the LISA language. It will be understood that embodiments of the present invention are not limited to the LISA language. The LISA language ("LISA") allows formalized descriptions of programmable architectures, their peripherals and interfaces. LISA was developed to close the gap between purely structural oriented languages (e.g., VHDL, Verilog) and instruction set languages for architecture exploration purposes. The language syntax of LISA is highly flexible, thus allowing the description of the instruction set of various processors, such as SIMD, MIMD and VLIW-type architectures. Moreover, processors with complex pipelines can be easily modeled with LISA.

Figure 3:
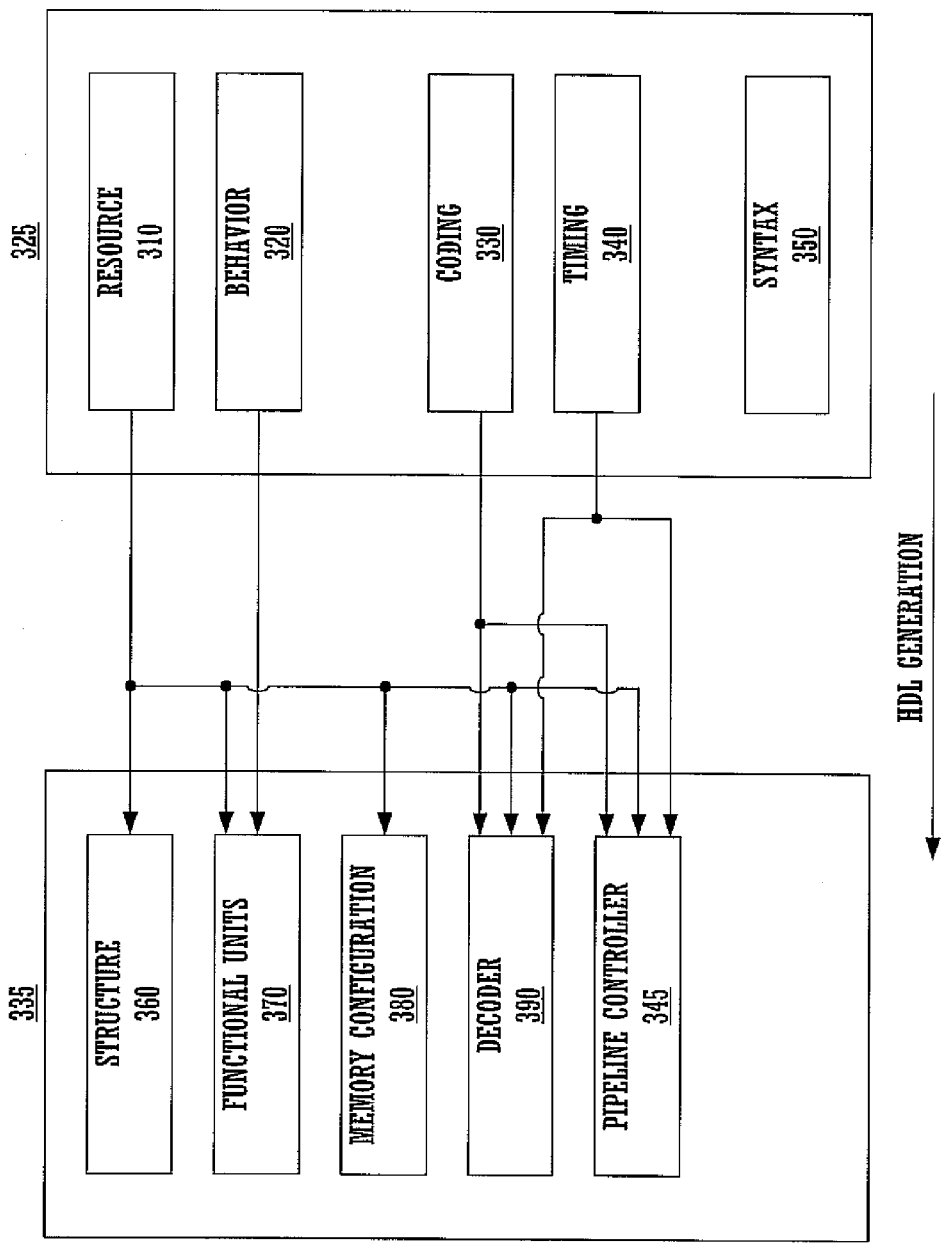
FIG. 3 is a diagram illustrating components of an HDL model generated from components of an ADL model according to an embodiment of the present invention.

FIG. 3 is an information flow diagram of exemplary ADL components 325, with a mapping to HDL components 335. The LISA language is suitable to implement the exemplary ADL components 325. The exemplary ADL components 325 in FIG. 3 includes the following components: a resource section 310, a behavior section 320, a coding section 330, an timing section 340, and syntax 350. The resource section 310 is a unique place to list all processor resources, such as registers, memories or pipelines. The coding section 330 describes the binary image of the instruction word, which is part of the instruction set model. The syntax section 350 describes the assembly syntax of instructions and their operands, which is part of the instruction set model. The behavior and expression section 320 describe components of the behavioral model. During simulation, the operation behavior is executed and modifies the values of resources, which drives system into a new state. The timing section 340 describes the timing of other operations relative to the current operation.

The various components of the exemplary ADL components 325 are sufficient for generating an HDL representation, each with their particular requirements, according to embodiments of the present invention. However, the present invention is not limited to using the exemplary ADL components 325. For example, an ADL that has a different organization than the exemplary ADL depicted in FIG. 3 may be used. Referring still to FIG. 3, the HDL structure 360, such as pipeline stages and pipeline registers, may be generated from the ADL resource section 310. The HDL functional units 370 may be generated from the ADL resource section 310 and the ADL behavior section 320. The HDL memory configuration 380, which summarizes the register and memory sets including the bus configuration, may be generated from the ADL resource section 310. The HDL decoders 390 may be generated from the ADL resource section 310, the ADL coding section 330, and the ADL timing section 340. The HDL pipeline controller 395 may be generated from the ADL resource section 310, the ADL coding section 330, and the ADL timing section 340.

The various ADL exemplary sections 310-340 are also sufficient for generating software tools (e.g., FIG. 1, 152-158). However, generating software tools is not a requirement of the present invention.

This relationship between the exemplary ADL components and generated HDL components may be the basis for a comprehensive implementation process, according to embodiments of the present invention. Changes to the HDL model may be applied either to the ADL description or, if desired, to the generated HDL description. In fact, the designer has full control over the generated HDL description with all of its components.

An embodiment of the present invention is directed to a computer-implemented method of automatically generating a control path in an HDL description from an ADL description. The acts described in process 400 of FIG. 4 may be stored as instructions on a computer readable medium and executed on a general-purpose processor. In one embodiment, process 400 is implemented in the compiler 130 of FIG. 1 to automatically generate decoders and control signals in the HDL description 135 of FIG. 1. Step 405 comprises accessing an architecture description written in an ADL. The architecture description may comprise a hierarchical organization. The architecture description written in the ADL may comprise operations and activation links. The state of the activation links determines whether the operations are to be executed. For example, referring now to FIG. 3, the activation links 240 determine whether an add, a subtract, or a load is to be performed in the execute (EX) stage 205.

In step 410, a structure is created in HDL from the ADL description. For example, referring briefly to FIG. 5, the a basic structure including a pipeline 502, registers 512, memory 514, pipeline stages 205, and pipeline registers 516 is generated.

In step 420, frames are automatically generated in the HDL description from the ADL description. The frames accommodate processes for implementing the operations of the ADL description. For example, referring to FIG. 2, the functional units 200 accommodate processes 230 corresponding to the operations 210. The frames provide a framework for the functional units and have control and data input ports, as well as output ports, in embodiments of the present invention.

Figure 4:
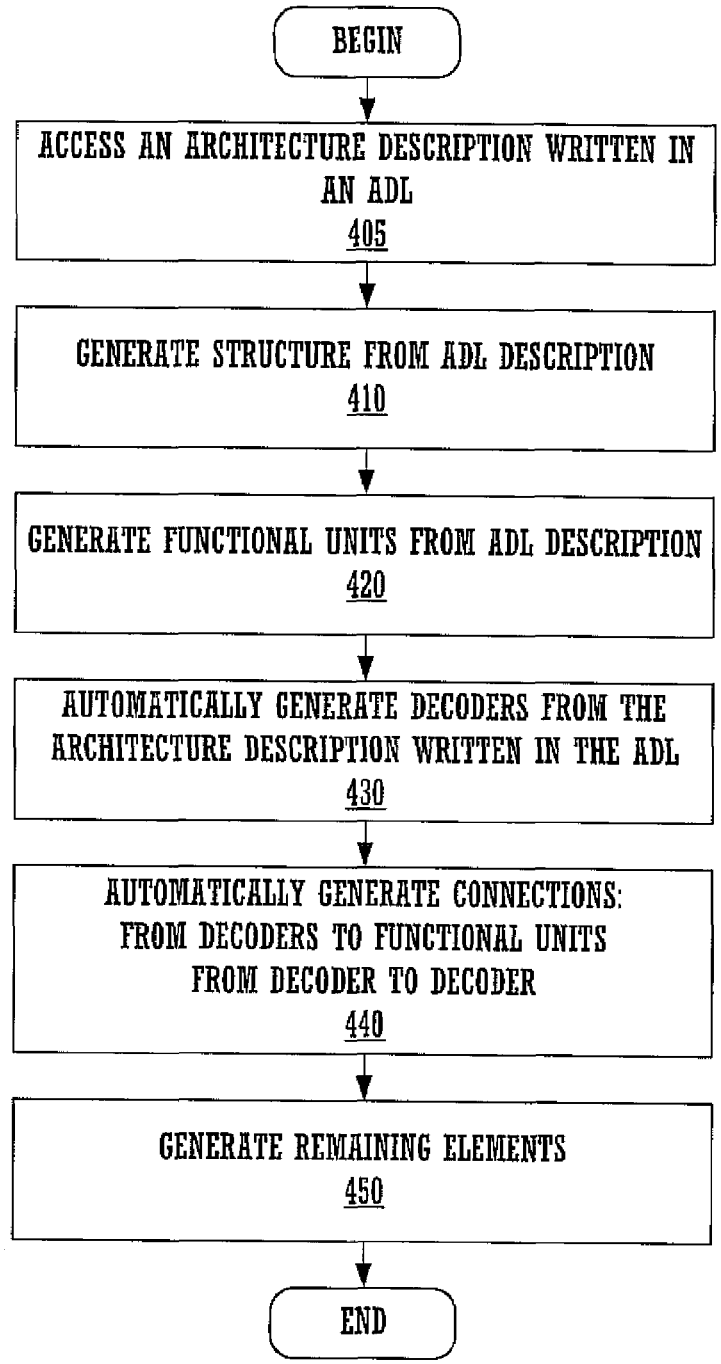
FIG. 4 is a flowchart illustrating steps of a process of generating a control path in an HDL according to an embodiment of the present invention.

In step 430 of FIG. 4, decoders are automatically generated from the architecture description written in the ADL. The decoders may be based on the activation links in the ADL description. For example, a decoder may be generated for each stage in which an activation link originates in the ADL description. The pipeline can have any number of stages and a decoder can be generated in any of the stages in the HDL description. A given decoder may be tailored to a specific stage of the pipeline. The decoders may be linked such that information may be passed from one decoder to the next in a pipeline. The decoders are described in an HDL. In various embodiments, the HDL is VHDL, Verilog, and SystemC.

In step 440, connections are generated from decoders to functional units, as well as from decoder to decoder. Thus, control signals are automatically generated and stored in the HDL description from the ADL description. The control signals are output from the decoders and are used as inputs to the frames. The configuration of the decoders and control signals preserves the hierarchical organization of the ADL description. The control signals in the HDL description may be derived from the activation links in the ADL description. The state(s) of the control signals may describe whether the processes in the HDL description are to be executed. Furthermore, connections are generated from one decoder to the next in the pipeline in order to transfer information down the pipeline.

In step 450, remaining elements are generated in the HDL description. For example, referring to FIG. 5, the mutliplexer 508, I/O control 522, and pipeline control 506 are generated. It is not required that the various elements are generated in the order described in process 400. Process 400 then ends.

Figure 5:
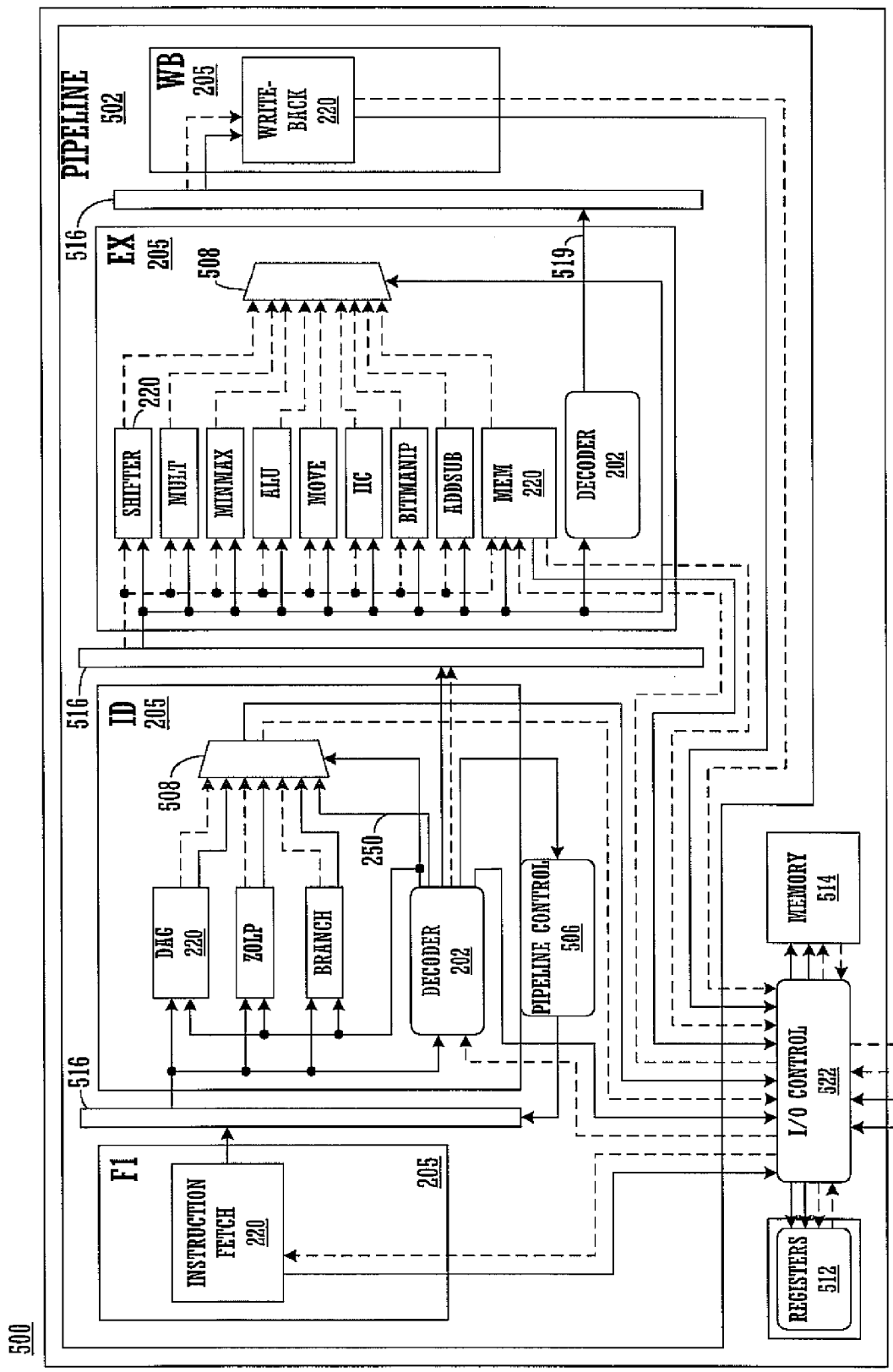
FIG. 5 is an exemplary HDL model generated according to an embodiment of the present invention.

FIG. 5 is an exemplary generated HDL model 500, according to an embodiment of the present invention. Embodiments of the present invention automatically generate the overall structure of the exemplary generated HDL 500, including components in the pipeline 502. In particular, a control path comprising decoders 202 and control signals 250 are automatically generated. Other components in the exemplary generated HDL 500 may or may not be automatically generated. By automatically generating the decoders 202 and control signals 250, the hierarchical organization of the ADL description from which the HDL description was made is preserved. In FIG. 5, the control signals 250 are depicted by solid arrows and the data path 519 is depicted by broken arrows.

The exemplary HDL model 500 includes a pipeline 502 consisting of entities representing the pipeline stages 205 and pipeline registers 516. The decoders 202 exist in several of the stages 205 and drive a pipeline controller 506. In an embodiment in which the ADL is compliant with the LISA 2.0 programming language, information from the LISA language provides a formalized way to initiate pipeline functions like flush or stall. This information is used in the construction of the pipeline 502. The pipeline stages 205 contain functional units 220, which implement the data path. The functional units 220 may be automatically generated as frames with all necessary input and output ports. In one embodiment, the data ports, such as operands, are derived from a behavior model (e.g., FIG. 3, 320). Additionally, the functional units 220 are connected to the respective control signals 250 driven by the decoder 202. Since all ports are derived from the ADL description, the existence of the ports is fully comprehensible to the designer. Changes to the ADL model are immediately reflected in the HDL model. The control signals 250 are used by the generated multiplexer 508 to ensure a correct execution of the respective functional unit 220.

Still referring to FIG. 5, multiplexers 508 are generated to avoid driver conflicts. These driver conflicts may appear if several functional units 220 require exclusive access to the same resources. In one embodiment, the compiler (FIG. 1, 130) derives the information about the exclusiveness from the ADL description to generate adequate multiplexers 508. The register resources 512 may be completely generated, including RTL level HDL code to model the register behavior, in one embodiment. In contrast, the memory entity 514 may be left empty, thus the designer may place a desired memory model into this entity. FIG. 5 also depicts I/O control 522.

Figure 6:
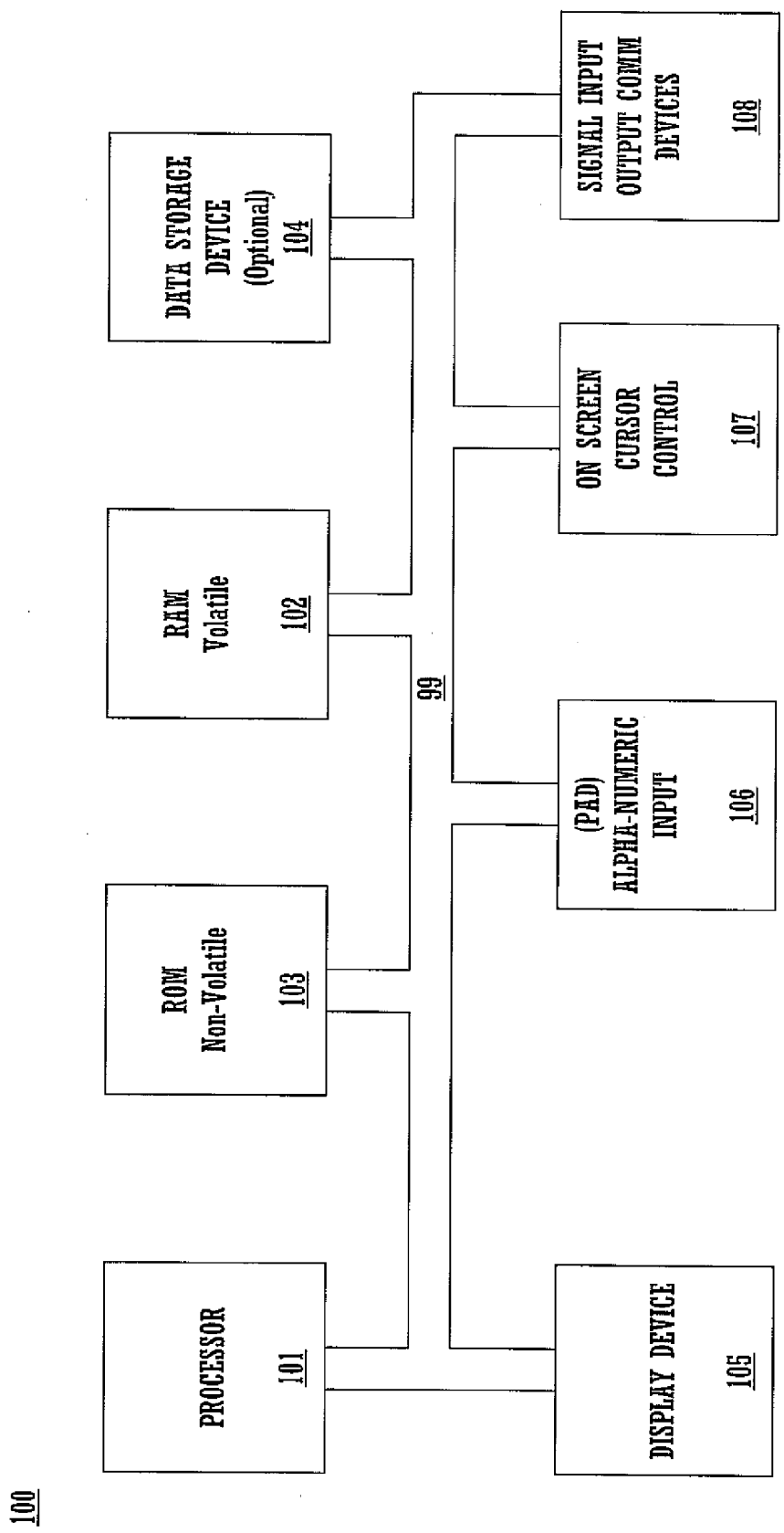
FIG. 6 is an exemplary computer system that may serve as a platform upon which embodiments of the present invention may be executed.

FIG. 6 illustrates circuitry of an exemplary computer system 100, which may form a platform for embodiments of automatically generating a control path in an HDL description from an ADL description. The compiler 130 of FIG. 1 may be implemented within computer system 100. Moreover, the ADL description 125 and the HDL description 135 may be stored in one of the memory units of computer system 100. Computer system 100 includes an address/data bus 99 for communicating information, a central processor 101 coupled with the bus for processing information and instructions, a volatile memory 102 (e.g., random access memory RAM) coupled with the bus for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 6, system 100 also includes an alphanumeric input device 106 including alphanumeric and function keys coupled to bus 99 for communicating information and command selections to central processor unit 101. System 100 also includes a cursor control device 107 coupled to bus 99 for communicating user input information and command selections to central processor unit 101. System 100 of the present embodiment also includes a display device 105 coupled to bus 99 for displaying information. A signal input/output communication device 108 coupled to bus 99 provides communication with external devices.

The preferred embodiment of the present invention, automatically generating a control path in an HDL description from an ADL description, is thus described. While the present invention has been described in particular embodiments, it should be appreciated that the present invention should not be construed as limited by such embodiments, but rather construed according to the below claims.

What is claimed is:

1. A method of translating to a hardware description language (HDL) from an architecture description language (ADL), said method comprising:
   a) accessing an architecture description written in said ADL, wherein said architecture description comprises a hierarchical organization;
   b) automatically generating a plurality of decoders, described in said HDL, from said architecture description written in said ADL; and
   c) automatically generating and storing a plurality of control signals, described in said HDL, from said architecture description written in said ADL, wherein said decoders are configured to output said control signals and wherein said control signals are for use as input to functional units.

2. The method of claim 1, wherein said architecture description written in said ADL comprises operations and activation links whose state during execution determines whether said operations are to be executed, and wherein said c) comprises automatically generating said control signals in said HDL description from said activation links in said ADL description.

3. The method of claim 2, wherein said functional units accommodate processes operable to implement said operations, wherein states of said control signals describe whether said processes are to be executed.

4. The method of claim 2, wherein said b) comprises automatically generating said decoders in said HDL description based on said activation links in said ADL description.

5. The method of claim 1, wherein said architecture description written in said ADL comprises operations and activation links whose state determines whether said operations are to be executed, and wherein said b) comprises automatically generating said decoders in said HDL description based on said activation links in said ADL description.

6. The method of claim 5, wherein said b) comprises automatically generating a decoder in stages of said HDL description, wherein any number of stages in said HDL description may be generated.

7. The method of claim 1, wherein said architecture description written in said ADL comprises a plurality of stages, and wherein said b) comprises automatically generating one of said decoders in said HDL for at least two different stages of said plurality of stages.

8. The method of claim 7, wherein said b) comprises tailoring said decoders to specific stages of a pipeline.

9. The method of claim 1, wherein said ADL description comprises a processor.

10. A computer readable medium having stored thereon instructions that when executed on a processor implement a method of translating to a hardware description language (HDL) from an architecture description language (ADL), said method comprising:
   a) accessing an architecture description written in said ADL, wherein said architecture description comprises a hierarchical organization;
   b) generating a plurality of decoders, described in said HDL, from said architecture description written in said ADL; and
   c) generating and storing a plurality of control signals, described in said HDL, from said architecture description written in said ADL, wherein said decoders are configured to output said control signals and wherein said control signals are for use as input to functional units.

11. The computer readable medium of claim 10, wherein said architecture description written in said ADL comprises operations and activation links, whose state determines whether said operations are to be executed, and wherein said b) of said method comprises generating said control signals in said HDL description from said activation links in said ADL description.

12. The computer readable medium of claim 11, wherein said functional units accommodate processes operable to implement said operations, wherein states of said control signals describe whether said processes are to be executed.

13. The computer readable medium of claim 11, wherein said b) of said method comprises generating said decoders in said HDL description based on said activation links in said ADL description.

14. The computer readable medium of claim 10, wherein said architecture description written in said ADL comprises operations and activation links that determine whether said operations are to be executed, and wherein said b) of said method comprises generating said decoders in said HDL description based on said activation links in said ADL description.

15. The computer readable medium of claim 14, wherein said b) of said method comprises generating a decoder in stages of said HDL description, wherein any number of stages in said HDL description may be generated.

16. The computer readable medium of claim 10, wherein said architecture description written in said ADL comprises a plurality of stages; and wherein said b) of said method comprises generating one of said decoders in said HDL for at least two different stages of said plurality of stages.

17. The computer readable medium of claim 16, wherein said b) of said method comprises tailoring said decoders to specific stages of a pipeline.

18. The computer readable medium of claim 16, wherein said method further comprises generating links between said decoders to pass information between said decoders.

19. The computer readable medium of claim 10, wherein said ADL description comprises a processor.

20. A method of translating to a hardware description language (HDL) from an architecture description language (ADL), said method comprising:
   a) accessing an ADL description, wherein said ADL description comprises operations and activation links having a hierarchical organization having a plurality of stages;
   b) automatically generating a decoder in an HDL description for each stage of said ADL description in which there is one of said activation links, wherein a plurality of decoders are automatically generated;
   c) automatically generating frames in said HDL description, said frames accommodating processes for implementing said operations; and
   d) automatically generating and storing control signals in said HDL description that are output from ones of said plurality of decoders and input to ones of said frames, wherein said hierarchical organization in said ADL description is preserved in said HDL description.

21. The method of claim 20, wherein said b) comprises tailoring said decoders to their respective stages of said HDL description.

22. The method of claim 20, further comprising e) automatically generating links between said plurality of decoders to pass information between said decoders.

23. The method of claim 20, wherein said ADL description comprises a processor implemented in an integrated circuit.

* * * * *